United States Patent
Yu et al.

(10) Patent No.: US 9,691,706 B2
(45) Date of Patent: Jun. 27, 2017

(54) MULTI-CHIP FAN OUT PACKAGE AND METHODS OF FORMING THE SAME

(75) Inventors: Chen-Hua Yu, Hsin-Chu (TW); Jing-Cheng Lin, Hsin-Chu (TW); Jui-Pin Hung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 845 days.

(21) Appl. No.: 13/452,140

(22) Filed: Apr. 20, 2012

(65) Prior Publication Data

US 2013/0187270 A1 Jul. 25, 2013

Related U.S. Application Data

(60) Provisional application No. 61/589,586, filed on Jan. 23, 2012.

(51) Int. Cl.
*H01L 23/48* (2006.01)
*H01L 23/538* (2006.01)
(Continued)

(52) U.S. Cl.
CPC ........ *H01L 23/5389* (2013.01); *H01L 21/561* (2013.01); *H01L 21/568* (2013.01); *H01L 24/19* (2013.01); *H01L 24/20* (2013.01); *H01L 24/24* (2013.01); *H01L 24/82* (2013.01); *H01L 24/92* (2013.01); *H01L 24/94* (2013.01); *H01L 24/96* (2013.01); *H01L 21/6836* (2013.01); *H01L 23/3128* (2013.01); *H01L 23/49816* (2013.01); *H01L 23/544* (2013.01); *H01L 24/11* (2013.01); *H01L 24/13* (2013.01); *H01L 24/742* (2013.01); *H01L 2221/68327* (2013.01); *H01L 2221/68331* (2013.01); *H01L 2223/54426* (2013.01); *H01L 2224/11334* (2013.01); *H01L 2224/12105* (2013.01); *H01L 2224/131* (2013.01); *H01L 2224/13147* (2013.01); *H01L 2224/211* (2013.01); *H01L 2224/2101* (2013.01); *H01L 2224/214* (2013.01); *H01L 2224/215* (2013.01); *H01L 2224/244* (2013.01); *H01L 2224/24011* (2013.01); *H01L 2224/24101* (2013.01); *H01L 2224/24137* (2013.01); *H01L 2224/24991* (2013.01); *H01L 2224/82005* (2013.01);
(Continued)

(58) Field of Classification Search
CPC ......... H01L 24/19; H01L 24/97; H01L 24/13; H01L 23/3128; H01L 23/5389
See application file for complete search history.

(56) References Cited

U.S. PATENT DOCUMENTS 6,244,499 B1 * 6/2001 Tsai ................... B23K 20/007
228/180.5
2004/0124513 A1 * 7/2004 Ho ......................... H01L 23/147
257/678
(Continued)

FOREIGN PATENT DOCUMENTS

CN 101621041 1/2010

*Primary Examiner* — Zandra Smith
*Assistant Examiner* — Abbigale Boyle
(74) *Attorney, Agent, or Firm* — Slater Matsil, LLP

(57) ABSTRACT

A package includes a die having a conductive pad at a top surface of the die, a stud bump over and connected to the conductive pad, and a redistribution line over and connected to the stud bump. An electrical connector is over and electrically coupled to the redistribution line.

18 Claims, 11 Drawing Sheets

(51) Int. Cl.
  *H01L 23/00*    (2006.01)
  *H01L 21/56*    (2006.01)
  H01L 23/498    (2006.01)
  H01L 23/544    (2006.01)
  H01L 21/683    (2006.01)
  H01L 23/31    (2006.01)
(52) U.S. Cl.
  CPC ........... *H01L 2224/8213* (2013.01); *H01L 2224/82106* (2013.01); *H01L 2224/82132* (2013.01); *H01L 2224/92* (2013.01); *H01L 2224/94* (2013.01); *H01L 2924/181* (2013.01); *H01L 2924/18162* (2013.01)

(56) References Cited

U.S. PATENT DOCUMENTS

| | | | |
|---|---|---|---|
| 2004/0145051 A1* | 7/2004 | Klein | H01L 21/563 257/734 |
| 2004/0178481 A1* | 9/2004 | Joshi | H01L 24/11 257/678 |
| 2004/0232543 A1* | 11/2004 | Goller et al. | 257/700 |
| 2005/0247944 A1* | 11/2005 | Haque et al. | 257/79 |
| 2006/0063312 A1* | 3/2006 | Kurita | H01L 21/563 438/127 |
| 2006/0134901 A1* | 6/2006 | Chaware | H01L 21/563 438/612 |
| 2011/0204513 A1* | 8/2011 | Meyer | H01L 24/96 257/738 |

* cited by examiner

MULTI-CHIP FAN OUT PACKAGE AND METHODS OF FORMING THE SAME

This application claims the benefit of the following provisionally filed U.S. patent application: Application Ser. No. 61/589,586, filed Jan. 23, 2012, and entitled "Multi-Chip Fan Out process and Structure," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a great throughput and a low cost. Further, less underfill or molding compound is needed. This packaging technology, however, also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the methods of forming the same are provided in accordance with an embodiment. The intermediate stages of manufacturing the package in accordance with embodiments are illustrated. Variations of the embodiments are also discussed. Throughout the various views and illustrative embodiments, like reference numbers are used to designate like elements.

Figure 1:
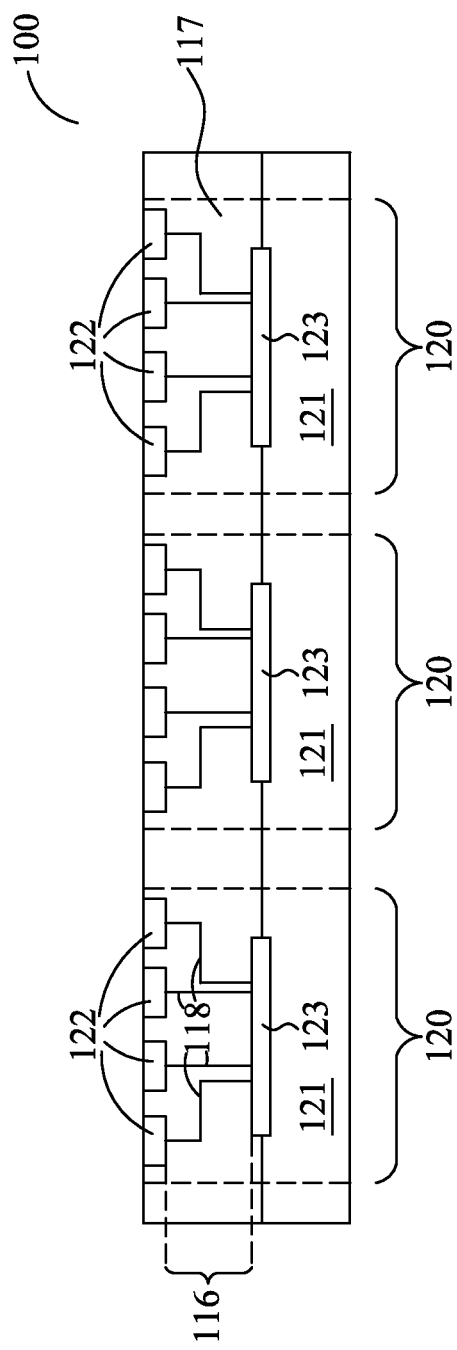
FIGS. 1 through 11 are cross-sectional views of intermediate stages in the manufacturing of a package in accordance with some exemplary embodiments.
Figure 2:
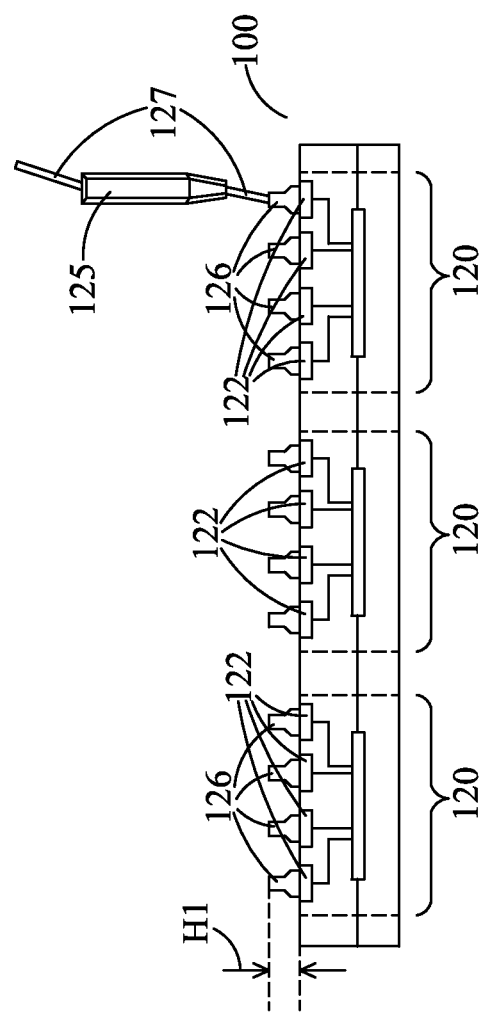
Figure 3:
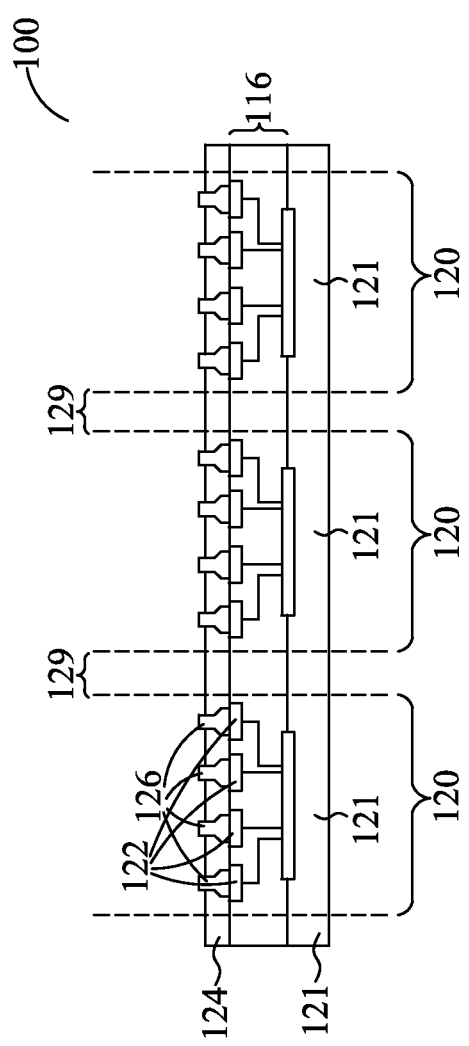

FIGS. 1 through 3 illustrate cross-sectional views in the formation of dies 120 in accordance with some exemplary embodiments. Referring to FIG. 1, wafer 100 is provided. Wafer 100 includes a plurality of chips 120 (also referred to as dies when sawed apart). Furthermore, wafer 100 (and dies 120 therein) may include semiconductor substrate 121, and may include integrated circuit devices 123 and the overlying interconnect structure 116. Integrated circuit devices 123 may include active devices such as transistors. In some exemplary embodiments, interconnect structure 116 includes metal lines and vias 118 formed in dielectric layers 117. Dielectric layers 117 may include low-k dielectric layers, for example, with k values lower than about 3.0, and passivation layers over the low-k dielectric layers. Conductive pads 122 are formed at the top surface of dies 120, and are electrically coupled to integrated circuit devices 123 through interconnect structure 116. In some embodiments, conductive pads 122 are bond pads. Conductive pads 122 may comprise metals such as aluminum, copper, nickel, gold, and combinations thereof. Alignment marks (not shown) may be formed adjacent to the top surface of dies 120, and are visible from top.

Referring to FIG. 2, in accordance with some embodiments, stud bumps 126 are formed on conductive pads 122, for example, using a wire bonding method. For example, metal wire 127 is bonded on conductive pads 122 by bond head 125 to form stud bumps 126. Stud bumps 126, due to the wire bonding process, have non-flat top surfaces, and non-vertical sidewalls. The metal wire 127 used for forming stud bumps 126 is broken, for example, by applying a force to pull wire 127 away from the respective stud bumps 126 after their formation. Accordingly, in accordance with some embodiments, substantially no wire 127 is left connected to the respective stud bumps 126, although short wires 127 may be left on stud bumps 126. Stud bumps 126 may comprise copper, gold, or the like, although other metals may be used or added. Height H1 of stud bumps 126 may be between about 10 µm and about 50 µm, for example. To increase height H1 without causing the lateral size of stud bumps 126 to increase, each of stud bumps 126 may include one or more than one stud bump stacked together.

Referring to FIG. 3, dielectric layer 124 is formed to fill into the space between stud bumps 126. The material of dielectric layer 24 may be selected from solder resists, a polymer such as polyimide, polybenzoxazole (PBO), benzocyclobutene (BCB), molding compound, and the like. The material of dielectric layer 124 may be soft for absorbing the stress applied on stud bumps 126. Stud bumps 126 may have their top surfaces level with the top surface of dielectric layer 124. Alternatively, stud bumps 126 may protrude out of dielectric layer 124. In yet other embodiments, stud bumps 126 may be embedded in dielectric layer 124.

After the curing of dielectric layer 124, wafer 100 is sawed along scribe lines 129, so that dies 120 are separated from each other. As a result of the sawing, in each of the resulting dies 120, the edges of dielectric layer 124 are aligned to the respective edges of the respective semiconductor substrate 121.

Figure 4:
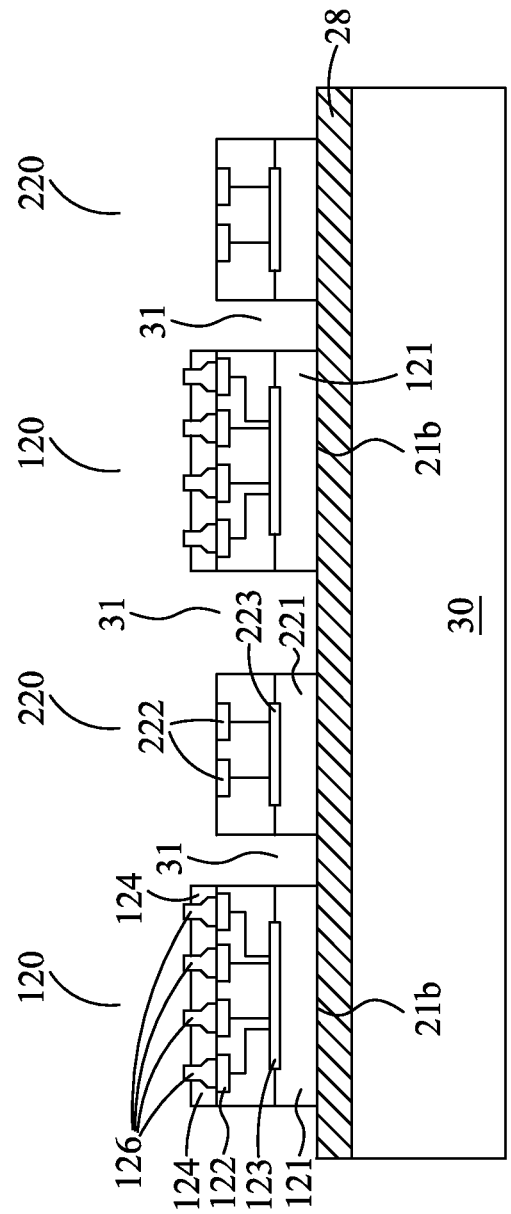

Referring to FIG. 4, adhesive layer 28 is disposed, for example, laminated, on carrier 30. Adhesive layer 28 may be formed of a glue, or may be a lamination layer formed of a foil. Dies 120 are then placed on carrier 30 and adhered to adhesive layer 28. In the embodiments wherein dies 120 include semiconductor substrates 121, the bottom surfaces 21b of semiconductor substrates 121 contact adhesive layer 28. Carrier 30 may include alignment marks (not shown), so that dies 120 and 220 are accurately mounted on desirable positions of carrier 30.

FIG. 4 also illustrates the placement of dies 220 on adhesive layer 28, wherein dies 220 may be identical to each other. In accordance with some embodiments, dies 220 are device dies, which may include active devices such as transistors 223 at the surfaces of the respective semiconductor substrates 221. In some embodiments, conductive pads 222 are formed on the top surfaces of dies 220. Conductive pads 222 may comprise gold, aluminum, copper, nickel, or combinations thereof. Dies 220 may have a structure different from that of dies 120, wherein the difference in the structure may include the difference in the circuits formed therein, the difference in the top-view sizes, the difference in the heights, and the like. In some embodiments, dies 220 may be formed from a wafer that has a different size than wafer 100 (FIG. 1). Spaces 31 are left between neighboring dies 120 and 220. When viewed from top, spaces 31 may form a grid that encircles each of dies 120 and 220.

Figure 5:
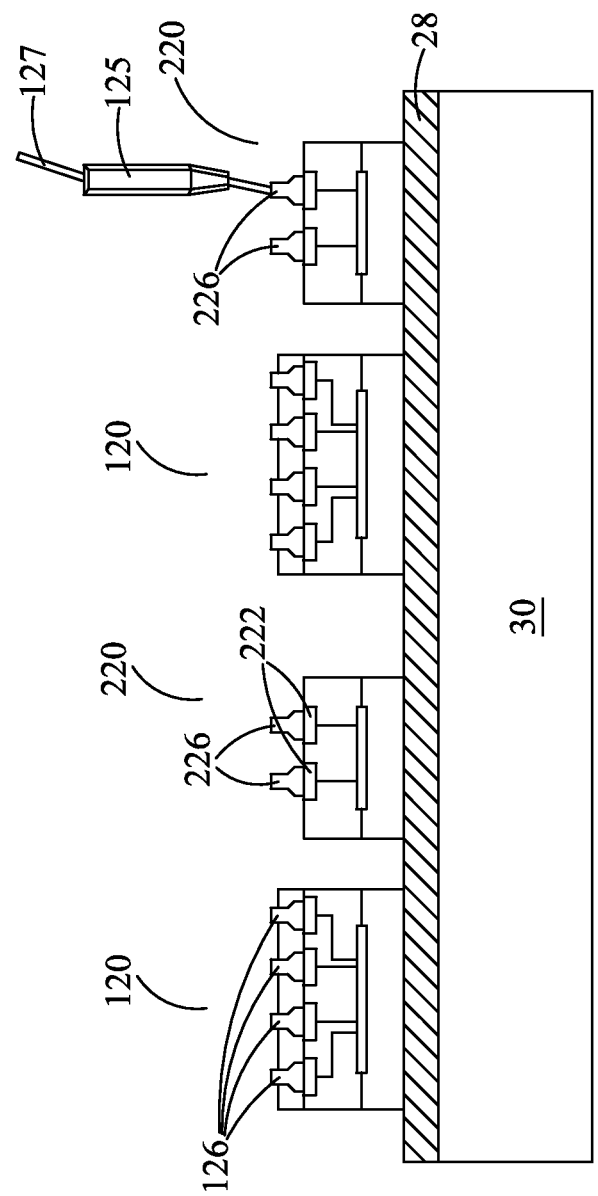
Figure 6:
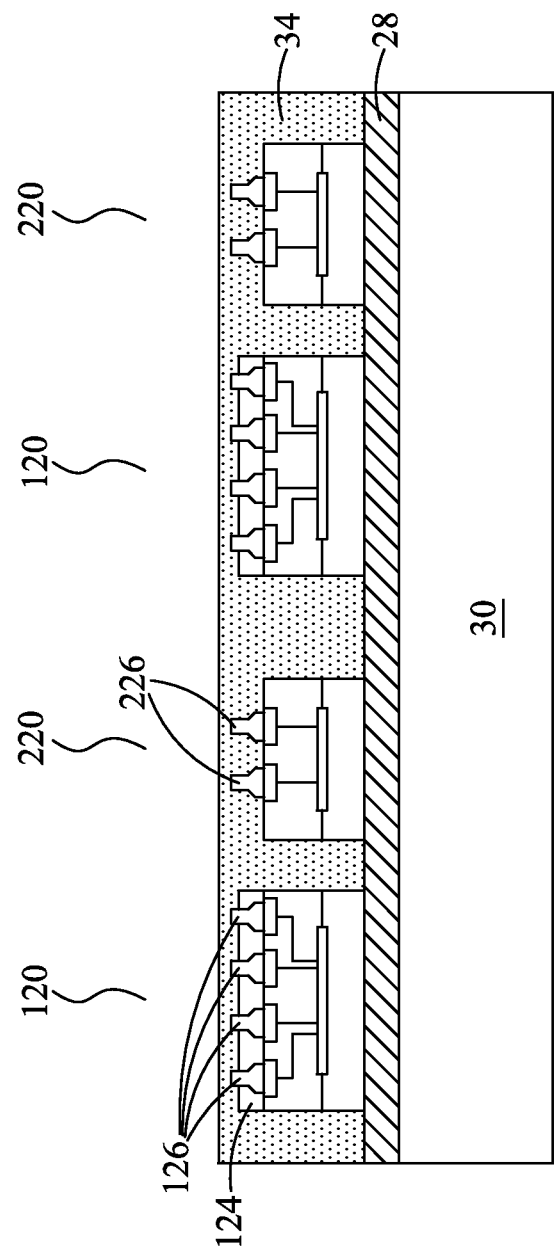

In accordance with some embodiments, dies 220 are placed on adhesive layer 28, with conductive pads 222 exposed at their top surfaces. Referring to FIG. 5, stud bumps 226 are formed on conductive pads 222. Stud bumps 226 may be formed of copper, gold, or the like. Similar to stud bumps 126, stud bumps 226 may be formed using a wire bonding method, wherein bond head 125 is used to bond wire 127 to form stud bumps 226. The resulting stud bumps 226 may be similar to stud bumps 126. After the formation of stud bumps 226, as shown in FIG. 6, polymer 34 is filled into the spaces between dies 120 and 220. In some exemplary embodiments, polymer 34 is a molding compound, and hence is referred to as molding compound 34 hereinafter, although it may be a material other than molding compound. For example, polymer 34 may be formed of other dielectric materials such as a molding underfill, an epoxy, or the like. Polymer 34 and dielectric layer 124 may be formed of a same material or different materials. The top surfaces of stud bumps 126 and 226 are also covered by molding compound 34. A curing process is then performed to solidify molding compound 34.

Figure 7:
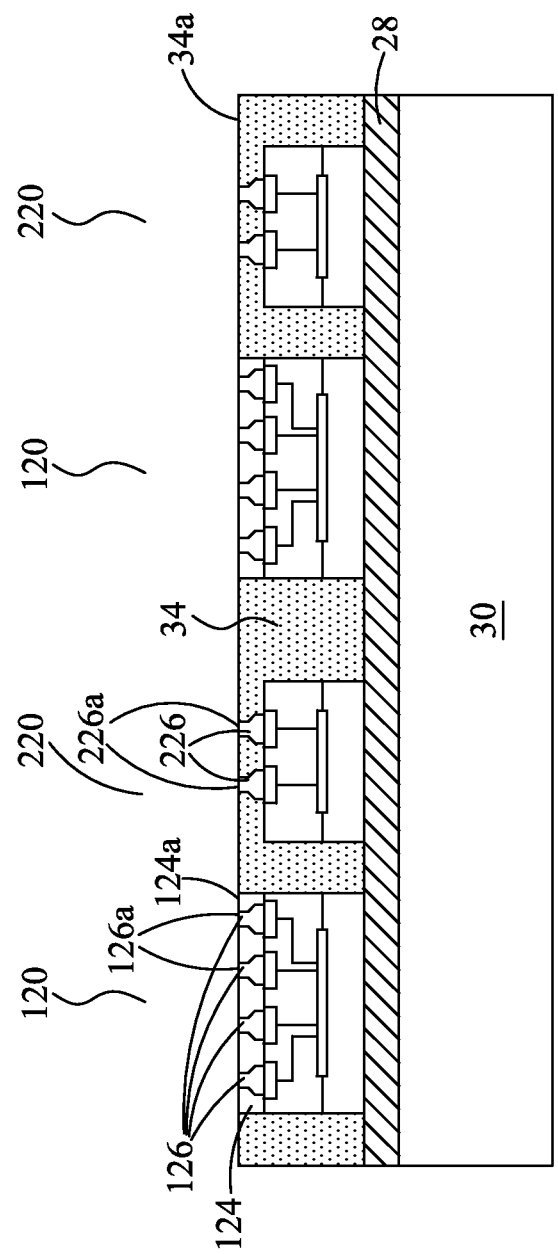

Referring to FIG. 7, a planarization such as a grinding step is performed on molding compound 34, until stud bumps 126 and 226, and possibly dielectric layer 124 in dies 120, are exposed. Accordingly, top surface 124a of dielectric layer 124, top surfaces 126a of stud bumps 126, top surfaces 226a of stud bumps 226, and top surface 34a of molding compound 34 may be substantially level with each other, and may be substantially flat. In the embodiments wherein stud bumps 126 are embedded in dielectric layer 124, a top surface layer of dielectric layer 124 may also be grinded, until stud bumps 126 are exposed. As a result of the grinding step, portions of molding compound 34, which portions are over stud bumps 126 and 226, are removed. When viewed from top, each of dies 120 and 220 and stud bumps 226 is surrounded by, and in contact with, molding compound 34. On the other hand, stud bumps 126 are surrounded by, and in contact with, dielectric layer 124, which is further surrounded by, and contacting, molding compound 34.

Figure 8:
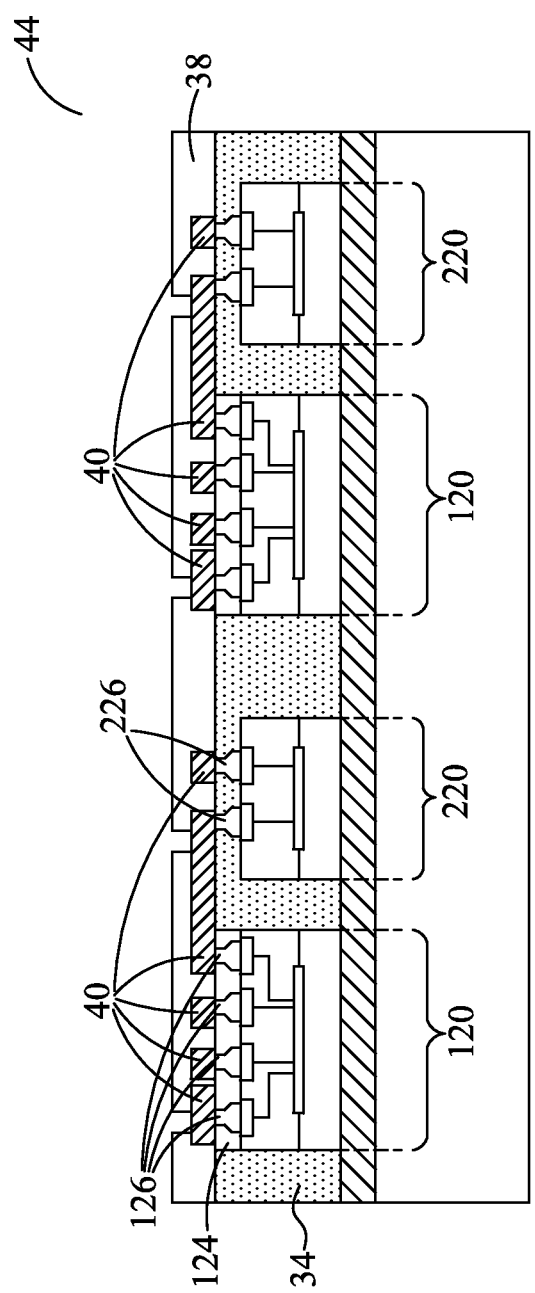

Next, as shown in FIG. 8, redistribution lines (RDLs) 40 are formed over dies 120 and 220, and are connected to stud bumps 126 and 226. In some embodiments, RDLs 40 have flat top surfaces and a substantially uniform thickness. RDLs 40 may be formed using, for example, a deposition method such as Physical Vapor Deposition (PVD), and possibly an etching step for patterning. Alternatively, the formation methods of RDLs 40 include damascene processes. RDLs 40 may be formed in dielectric layer(s) 38, and may include metal lines and vias. In some embodiments, RDLs 40 extend beyond edges of the respective dies 120 and 220 and overlapping the portions of molding compound 34 that are filled between dies 120 and 220. Accordingly, the resulting package is a fan-out package. During the formation of RDLs 40, the alignment marks (not shown) in dies 120 may be used for alignment purpose since dielectric layer 124 may be transparent. On the other hand, since dies 220 are covered by, for example, a molding compound, the alignment marks in dies 220 may not be seen through the opaque molding compound. Accordingly, the use of dies 120 (in which dielectric layer 124 is pre-formed) along with dies 220 provide alignment means for aligning the formation of RDLs 40. Wafer 44, which includes dies 120 and 220, molding compound 34, and RDLs 40, is thus formed.

Figure 9:
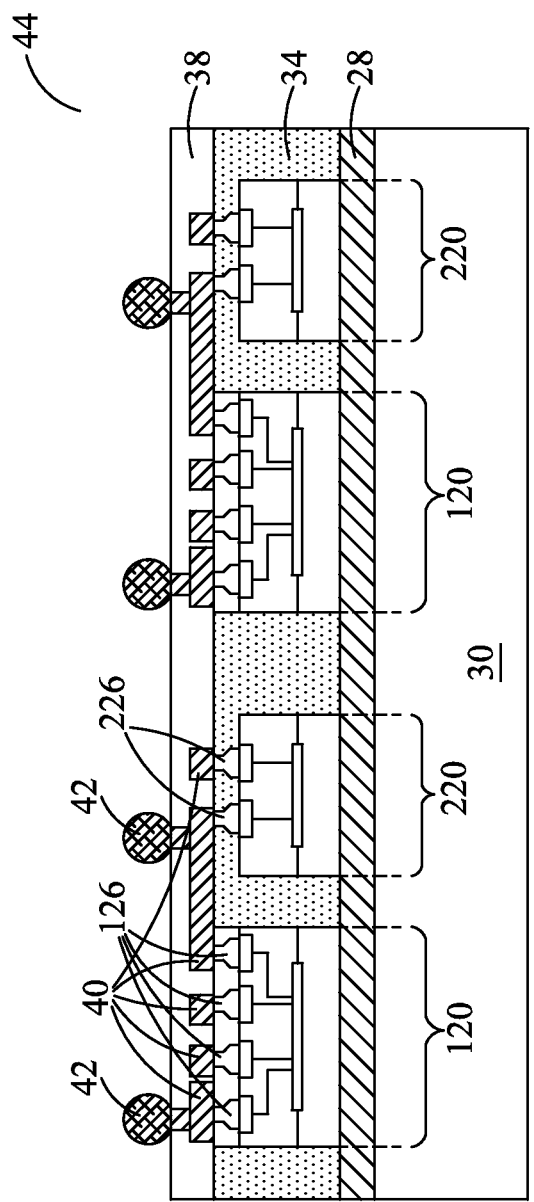

FIG. 9 illustrates the formation of electrical connectors 42, which are electrically coupled to RDLs 40. As a result, electrical connectors 42 are located on the top surface of the newly formed wafer 44. Electrical connectors 42 may be solder balls that are transferred onto wafer 44 using a ball-mounting head (not shown). Alternatively, electrical connectors 42 are non-reflowable bumps such as copper bumps or copper pillars. Some of electrical connectors 42 may be formed over and aligned to dies 120 and 220, while some other electrical connectors 42 may also be formed over and aligned to molding compound 34, and aligned to the spaces between dies 120 and 220.

Figure 10:
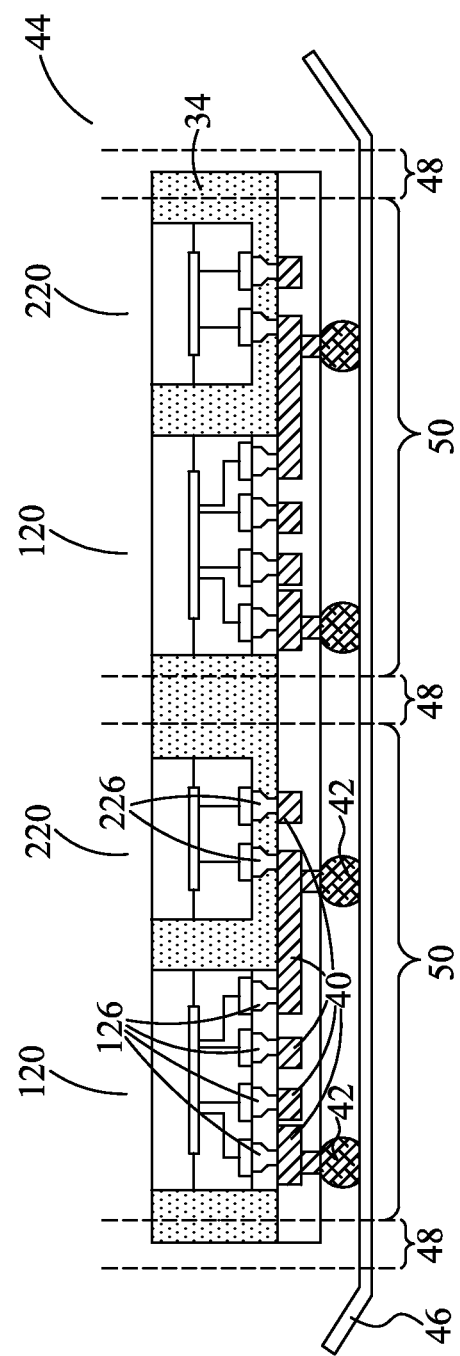

Next, as shown in FIG. 10, carrier 30 is demounted from wafer 44, and adhesive layer 28 may also be removed, leaving wafer 44. Wafer 44 may then be attached onto tape 46, and sawed apart along scribe lines 48. Accordingly, packages 50 are formed.

Figure 11:
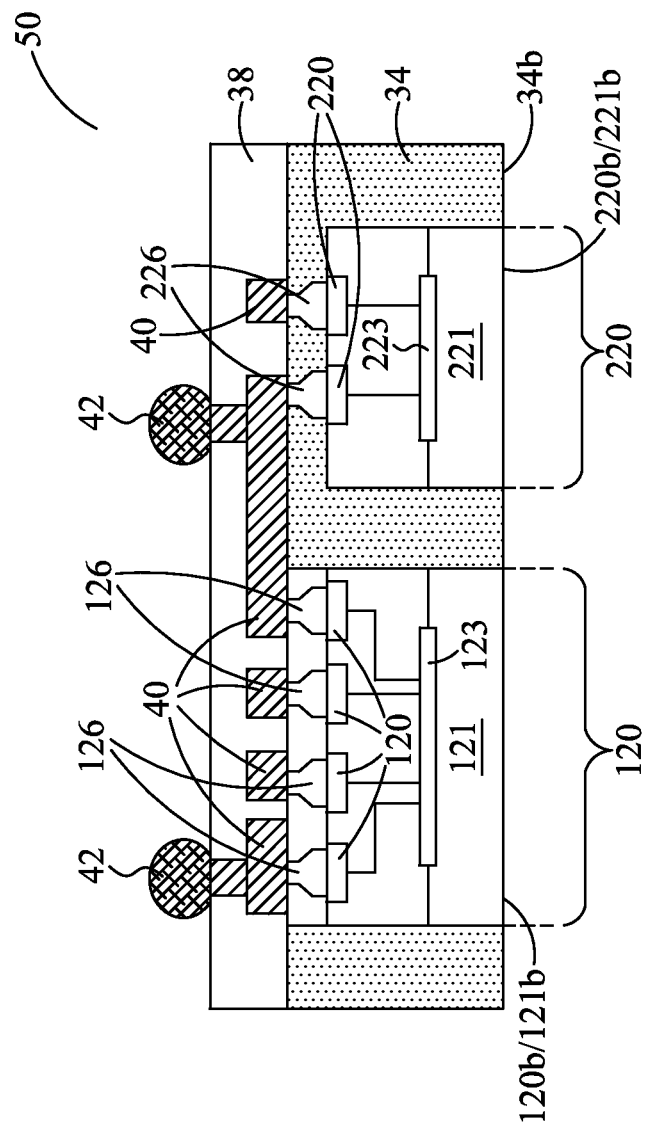

FIG. 11 illustrates one of exemplary packages 50. It is appreciated that in each of packages 50, the bottom surface 120b of die 120 and bottom surface 220b of die 220 are substantially level with bottom surface 34b of molding compound 34. Furthermore, bottom surface 120b of die 120 may also be the bottom surface 121b of substrate 121, and bottom surface 220b of die 220 may also be the bottom surface 221b of substrate 221. Accordingly, the bottom surface 121b of substrate 121 and bottom surface 221b of substrate 221 are level with bottom surface 34b of molding compound 34. On the top side, RDLs 40 are formed over, and connected to, stud bumps 126 and 226. Furthermore, RDLs 40 may extend over the portion of molding compound 34 that fills the spaces between dies 120 and 220. Accordingly, package 50 is a fan out package. Furthermore, polymer 34 may encircle and in contact with each of bumps 226.

FIGS. 1 through 11 illustrate the formation of package 50, which includes dies 120 and 220 that are different from each other. In alternative embodiments, in the step shown in FIG. 4, a plurality of dies that are similar to dies 120 are placed on adhesive 28 (FIG. 4). Each of the plurality of dies includes the pre-formed stud bumps (similar to stud bumps 126) and the pre-formed dielectric layer (similar to dielectric layer 124). However, the plurality of dies may include two or more types of dies having different structures. The dies similar to dies 220 and do not include pre-formed stud bumps, however, are not placed on adhesive 28. The resulting package is similar to package 50 shown in FIG. 11, except that die 220 in FIG. 11 is also replaced by a die that has the pre-formed stud bumps and a respective dielectric layer.

In alternative embodiments, all dies placed on adhesive 28 (FIG. 4) do not include pre-formed stud bumps. The resulting package is similar to what is shown in FIG. 11, except that die 120 in FIG. 11 is replaced by a die that does not have the pre-formed stud bumps and the respective dielectric layer.

In the embodiments, by forming stud bumps and redistribution layers over the stud bumps, dies that are not suitable for forming metal pillars may be packaged. The cost for the packaging is reduced, and the process time is shortened. The embodiments may be easily applied on the dies having different wafer sizes, and hence the production tools for forming the copper pillars on legacy wafers, such as 4-inch wafers, are not needed.

In accordance with embodiments, a package includes a die having a conductive pad at a top surface of the die, a stud bump over and connected to the conductive pad, and a redistribution line over and connected to the stud bump. An electrical connector is over and electrically coupled to the redistribution line.

In accordance with other embodiments, a device includes a die that further includes a semiconductor substrate, and a conductive pad at a top surface of the die. A stud bump is disposed over and connected to the conductive pad. A polymer encircles the die and contacts the sidewalls of the die. A bottom surface of the polymer is substantially level with a bottom surface of the semiconductor substrate. A top surface of the polymer is substantially level with a top surface of the stud bump. A redistribution line is over and connected to the stud bump.

In accordance with yet other embodiments, a method includes placing a die over a carrier. The die includes a substrate, a conductive pad over the substrate, and a stud bump over and electrically connected to the conductive pad. A polymer is applied to cover the die, wherein the polymer surrounds the die. A portion of the polymer overlapping the die is removed to expose the stud bump. A redistribution line is formed over the stud bump, wherein the redistribution line is electrically coupled to the conductive pad through the stud bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first die comprising:
      a conductive pad at a top surface of the first die and a semiconductor substrate underlying the conductive pad;
      a first stud bump over and connected to the conductive pad, wherein the first stud bump is a wire bonding stud bump having non-vertical sidewalls and a first planar top surface; and
      a dielectric layer, wherein the first stud bump is in the dielectric layer, and edges of the dielectric layer are coplanar with respective edges of the semiconductor substrate, wherein a top surface of the dielectric layer is coplanar with the first planar top surface of the first stud bump;
   a second die comprising:
      active devices; and
      a second stud bump electrically coupled to the active devices, wherein the second stud bump is a wire bonding stud bump having non-vertical sidewalls;
   a polymer encircling the first die and contacting sidewalls of the first die, wherein the dielectric layer and the polymer comprise different materials, and the polymer comprises a portion directly over a portion of the second die and in physical contact with the second stud bump;
   a redistribution line over and contacting the first stud bump; and
   an electrical connector over and electrically coupled to the redistribution line.

2. The device of claim 1, wherein a bottom surface of the polymer is substantially level with a bottom surface of the first die.

3. The device of claim 1, wherein a top surface of the polymer is level with the first planar top surface of the first stud bump.

4. A device comprising:
   a first die comprising:
      a semiconductor substrate;
      a first conductive pad at a top surface of the first die; and
      a first stud bump over and connected to the first conductive pad, wherein the first stud bump is a wire bonding stud bump having non-vertical sidewalls and a first planar top surface;
   a polymer encircling the first die and contacting sidewalls of the first die, wherein a bottom surface of the polymer is substantially level with a bottom surface of the semiconductor substrate, and a top surface of the polymer is substantially level with the first planar top surface of the first stud bump; and
   a first redistribution line over and contacting the first stud bump; and
   a dielectric layer, wherein the first stud bump is in the dielectric layer, and the first stud bump is spaced apart from the polymer by the dielectric layer, wherein the dielectric layer and the polymer comprise different materials, and wherein edges of the dielectric layer are perpendicular to the bottom surface of the polymer, and a top surface of the dielectric layer is coplanar with the first planar top surface of the stud bump;
   a second die encircled by the polymer, wherein the second die comprises:
      a second substrate;
      active devices at a surface of the second substrate;
      a second conductive pad at a top surface of the second die; and
      a second stud bump over and connected to the second conductive pad, wherein the polymer comprises a portion overlapping the second die, and wherein the portion of the polymer encircles and physically contacts the second stud bump.

5. The device of claim 4, wherein the edges of the dielectric layer are coplanar with respective edges of the semiconductor substrate.

6. The device of claim 4, wherein the top surface of the polymer is substantially level with a top surface of the second stud bump.

7. The device of claim 4, wherein the polymer comprises a portion disposed into a space between the first die and the second die, and wherein the first redistribution line overlaps the portion of the polymer.

8. A device comprising:
  a first die comprising:
    a conductive pad at a top surface of the first die;
    a first stud bump comprising:
      a bump portion with a non-flat top surface, wherein a bottom surface of the bump portion is in physical contact with a top surface of the conductive pad; and
      a wire portion over and connected to the bump portion, wherein the wire portion and the bump portion are formed of a same material, and are connected to each other integrally, and the wire portion has a first planar top surface;
    a first dielectric layer encircling and in physical contact with both the bump portion and the wire portion of the first stud bump, with a top surface of the first dielectric layer being coplanar with a top surface of the wire portion;
  a molding compound encircling and contacting edges of the first die, with a top surface of the molding compound being coplanar with a top surface of the wire portion;
  a second dielectric layer over a top surface of the first die and over and contacting the top surface of the molding compound;
  a redistribution line in the second dielectric layer and contacting the top surface of the wire portion;
  a solder region over and electrically coupled to the redistribution line; and
  a second die comprising active circuits and a second stud bump, wherein the second stud bump is a wire bonding stud bump having non-vertical sidewalls, wherein the molding compound is in physical contact with the second stud bump, wherein the second stud bump has a second planar top surface coplanar with both the first planar top surface and the top surface of the molding compound, and wherein a back surface of the first die and a back surface of the second die are both coplanar with a surface of the molding compound.

9. The device of claim 8, wherein the conductive pad and the first stud bump are formed of different materials.

10. The device of claim 8, wherein the bump portion is wider than the wire portion.

11. The device of claim 8, wherein the molding compound is in physical contact with the second stud bump.

12. The device of claim 8, wherein the first die further comprises a semiconductor substrate, and edges of the first dielectric layer are co-terminus with edges of the semiconductor substrate.

13. The device of claim 2, wherein the bottom surface of the polymer is coplanar with a bottom surface of the semiconductor substrate.

14. The device of claim 1, wherein the dielectric layer comprises polybenzoxazole (PBO) or benzocyclobutene (BCB).

15. The device of claim 8, wherein the first dielectric layer comprises polybenzoxazole (PBO).

16. The device of claim 8, wherein the first dielectric layer comprises benzocyclobutene (BCB).

17. The device of claim 1, wherein the second stud bump has a second planar top surface coplanar with both the first planar top surface and the top surface of the polymer, and wherein a back surface of the first die and a back surface of the second die are both coplanar with a bottom surface of the polymer.

18. The device of claim 4, wherein the second stud bump has a second planar top surface coplanar with both the first planar top surface and the top surface of the polymer, and wherein a bottom surface of the second die is coplanar with the bottom surface of the polymer.

* * * * *